United States Patent
Chen

(10) Patent No.: US 9,024,510 B1
(45) Date of Patent: May 5, 2015

(54) COMPLIANT ELECTRODE AND COMPOSITE MATERIAL FOR PIEZOELECTRIC WIND AND MECHANICAL ENERGY CONVERSIONS

(75) Inventor: Bin Chen, Palo Alto, CA (US)

(73) Assignee: The United States of America as Represented by the Administrator of the National Aeronautics & Space Administration (NASA), Washington, DC (US)

(*) Notice: Subject to any disclaimer, the term of this patent is extended or adjusted under 35 U.S.C. 154(b) by 368 days.

(21) Appl. No.: 13/544,752

(22) Filed: Jul. 9, 2012

(51) Int. Cl.
| | |
|---|---|
| *H02N 2/18* | (2006.01) |
| *H01L 41/193* | (2006.01) |
| *H01L 41/047* | (2006.01) |
| *H01L 41/187* | (2006.01) |
| *H01L 41/29* | (2013.01) |
| *H01L 41/293* | (2013.01) |
| *B82Y 99/00* | (2011.01) |

(52) U.S. Cl.
CPC .............. *H01L 41/193* (2013.01); *B82Y 99/00* (2013.01); *H01L 41/0477* (2013.01); *H01L 41/0478* (2013.01); *H01L 41/187* (2013.01); *H01L 41/29* (2013.01); *H01L 41/293* (2013.01); *H02N 2/186* (2013.01)

(58) Field of Classification Search
CPC ........ H01L 41/183; H02N 2/18; H02N 2/185; H02N 2/186
USPC ......................................................... 310/339
See application file for complete search history.

(56) References Cited

U.S. PATENT DOCUMENTS

| | | | | |
|---|---|---|---|---|
| 4,128,489 | A * | 12/1978 | Seo ........................... | 252/62.9 R |
| 4,675,123 | A * | 6/1987 | Tsunooka et al. ........ | 252/62.9 R |
| 5,067,488 | A * | 11/1991 | Fukada et al. ................ | 600/590 |
| 6,583,533 | B2 * | 6/2003 | Pelrine et al. ................. | 310/309 |
| 7,936,111 | B2 * | 5/2011 | Choi et al. ..................... | 310/339 |
| 8,247,952 | B2 * | 8/2012 | Chang ............................ | 310/339 |
| 2005/0206275 | A1 * | 9/2005 | Radziemski et al. ......... | 310/339 |
| 2009/0121585 | A1 * | 5/2009 | Lee et al. ....................... | 310/319 |
| 2010/0308592 | A1 * | 12/2010 | Frayne ............................ | 290/54 |
| 2012/0007473 | A1 * | 1/2012 | Oh ................................. | 310/339 |
| 2012/0038249 | A1 * | 2/2012 | Lu et al. ......................... | 310/338 |
| 2012/0074239 | A1 * | 3/2012 | Chang ............................ | 238/122 |
| 2013/0257156 | A1 * | 10/2013 | Hadimani et al. ............. | 307/48 |
| 2013/0293068 | A1 * | 11/2013 | Nishida et al. ................ | 310/339 |
| 2014/0111063 | A1 * | 4/2014 | Bae et al. ....................... | 310/339 |

FOREIGN PATENT DOCUMENTS

WO    WO 2011089803 A1 *   7/2011

OTHER PUBLICATIONS

Bin Liang, Piezoelectric Polymers for Wind and Kinetic Energy Conversions, Mar. 2010, pp. 1-66, University of California, Santa Cruz.

John Lake et al, Piezoelectric Materials and Devices for Wind Energy Harvesting, Jul. 7, 2011, pp. 1-6.

* cited by examiner

*Primary Examiner* — J. San Martin
(74) *Attorney, Agent, or Firm* — Christopher J. Menke; Robert M. Padilla

(57) ABSTRACT

A thin film device for harvesting energy from wind. The thin film device includes one or more layers of a compliant piezoelectric material formed from a composite of a polymer and an inorganic material, such as a ceramic. Electrodes are disposed on a first side and a second side of the piezoelectric material. The electrodes are formed from a compliant material, such as carbon nanotubes or graphene. The thin film device exhibits improved resistance to structural fatigue upon application of large strains and repeated cyclic loadings.

30 Claims, 4 Drawing Sheets

COMPLIANT ELECTRODE AND COMPOSITE MATERIAL FOR PIEZOELECTRIC WIND AND MECHANICAL ENERGY CONVERSIONS

ORIGIN OF INVENTION

The invention described herein was made in the performance of work under a NASA contract, and is subject to the provisions of Public Law 96-517 (35 U.S.C. §202) in which the Contractor has elected not to retain title.

BACKGROUND OF INVENTION

1. Technical Field of the Invention

This invention relates generally to the field of energy harvesting, and more particularly, but not entirely, to piezoelectric energy harvesters.

2. Description of Related Art

Energy harvesting, also known as power harvesting or energy scavenging, is the process by which energy is derived from external sources, collected and stored. Energy harvesting devices can include devices that harvest energy from solar, thermal, wind, wave and other kinetic sources. Typically, thin film energy harvesters provide the power for wearable devices or stretchable electronics. However, despite the low-energy production of these energy harvesters, they have a small form factor, and they have the advantage of tapping energy from freely available sources.

Energy harvesting devices can be utilized to power low-power electronics. For example, harvested energy can be utilized to power sensors at remote locations where traditional power sources are unavailable or are too expensive. The energy generated by an energy harvesting device can be stored in a capacitor or a battery.

Piezoelectric materials have generated considerable interest as energy harvesters because of their unique properties. In particular, piezoelectric materials generate a small voltage whenever they are mechanically deformed. Generally speaking, piezoelectric materials fall into three different categories: piezoelectric ceramics, piezoelectric polymers and piezoelectric co-polymers.

One widely studied piezoelectric polymer is polyvinylidene fluoride ("PVDF"). PVDF is a highly non-reactive and pure thermoplastic fluoropolymer. One advantage to the use of PVDF is that it is low cost compared to other fluoropolymers. PVDF is not naturally a piezoelectric material. In order to use PVDF as a piezoelectric, it must be properly prepared. Preparation of PVDF as a piezoelectric includes producing thin films of PVDF that are then turned from an inert polymer to a poled piezoelectric film by increasing polarization density. Typically, polarization is increased by stretching and heating the PVDF film.

Attempts have been made to utilize PVDF, in its piezoelectric form, to harvest energy. One previous attempt included using PVDF to harvest wind energy. In particular, gold electrodes were attached to either side of a small, thin film sheet of PVDF. Leads connected the gold electrodes to a simple charging circuit. The PVDF sample was then placed in a vortex created in a wind tunnel which caused the PVDF sample to oscillate. While the PVDF sample in this attempt initially produced good results, after a short period of time, as short as one or two hours, the gold electrodes began to crack from stress caused by the oscillation of the PVDF sample in the wind current.

In addition, the thin film of the PVDF sample itself showed signs of stress fatigue from the oscillations. This attempt was therefore deemed unsuitable for a real-world application because of the short life of the PVDF sample and the gold electrodes in the lab. Attempts were made to use commercially available non-metal conductive epoxies as electrodes. However, these thicker electrode materials unduly dampened the mechanical strains necessary to generate energy.

It would therefore be an improvement over the previously available devices to provide piezoelectric materials and electrodes that are more compliant and less susceptible to fatigue in real-world applications. It would further be an improvement over the previously available devices to provide electrodes for use with piezoelectric devices that are compliant and that do not overly interfere with the generation of energy. It would further be an improvement over the previously available devices to provide electrodes for use with piezoelectric devices that have an improved mechanical and interfacial bonding to the piezoelectric material and that are flexible enough to allow large strains in the piezoelectric material to occur and that remain electrically conductive upon application of large strains and repeated cyclic loadings.

The features and advantages of the present disclosure will be set forth in the description that follows, and in part will be apparent from the description, or may be learned by the practice of the present disclosure without undue experimentation. The features and advantages of the present disclosure may be realized and obtained by means of the instruments and combinations particularly pointed out in the appended claims.

SUMMARY OF THE INVENTION

Accordingly and advantageously, the present invention relates to a system, method, and device for harvesting energy from wind using a piezoelectric material. The present invention provides a lightweight, low-form factor and portable energy generation device suitable for use in low-power applications. In an illustrative embodiment, the present invention provides portable, lightweight energy-generation devices for off-grid applications.

In an illustrative embodiment, the present invention further provides a piezoelectric material that is more compliant and less susceptible to damage from fatigue than previously available piezoelectric materials. In an illustrative embodiment, the present invention also provides an electrode for use with a piezoelectric material that is more compliant and less susceptible to damage from fatigue that previously available electrodes.

In an illustrative embodiment, the present invention provides electrodes for use with piezoelectric devices that have an improved mechanical and interfacial bonding to the piezoelectric material and that are flexible enough to allow large strains in the piezoelectric material to occur and that remain electrically conductive upon application of large strains and repeated cyclic loadings.

In an illustrative embodiment, the present invention further provides a method of fabricating energy harvesters for the conversion of wind energy as a sustainable and long-term energy source. The energy harvesters may include one thin film or multilayer thin films of a compliant piezoelectric material sandwiched between two electrodes that is able to withstand a prolonged exposure to wind buffeting.

In an illustrative embodiment, the energy harvester of the present invention includes a stacked layer of piezoelectric thin films sandwiched between two electrodes. In an illustrative embodiment, the piezoelectric material is comprised of one or more layers of a thin film of a composite material. In an illustrative embodiment, the piezoelectric material is formed from a composite of a polymer and an inorganic material, such as ceramic. In an illustrative embodiment, the piezoelectric material is formed from a composite of PVDF and nanowires, such as zinc oxide nanowires. In an illustrative embodiment, the piezoelectric material is formed from about 5% to about 20% of an inorganic material, such as zinc oxide nanowires. In an illustrative embodiment, the piezoelectric material is formed from about 10% to about 15% of an inorganic material, such as zinc oxide nanowires.

In an illustrative embodiment, the electrodes of the energy harvester may comprise a compliant material. In an illustrative embodiment, the electrodes of the energy harvester may be formed from nanotubes, such as carbon nanotubes. In an illustrative embodiment, the electrodes of the energy harvester may be formed of graphene.

In an illustrative embodiment, the invention may further comprise an energy harvester connected to a circuit for wind energy conversion and storage. The circuit may comprise a rectifier for converting AC voltage into DC voltage. The circuit may further comprise an energy storage device, such as a capacitor, for storing energy generated from an energy harvester. The stored energy may be utilized to power a low-voltage device, such as a cell phone, computer, or a sensor.

These and other advantages are achieved in accordance with various illustrative embodiments of the present invention as described in detail below.

BRIEF DESCRIPTION OF THE DRAWINGS

The features and advantages of the disclosure will become apparent from a consideration of the subsequent detailed description presented in connection with the accompanying drawings in which.

DETAILED DESCRIPTION

Figure 1:
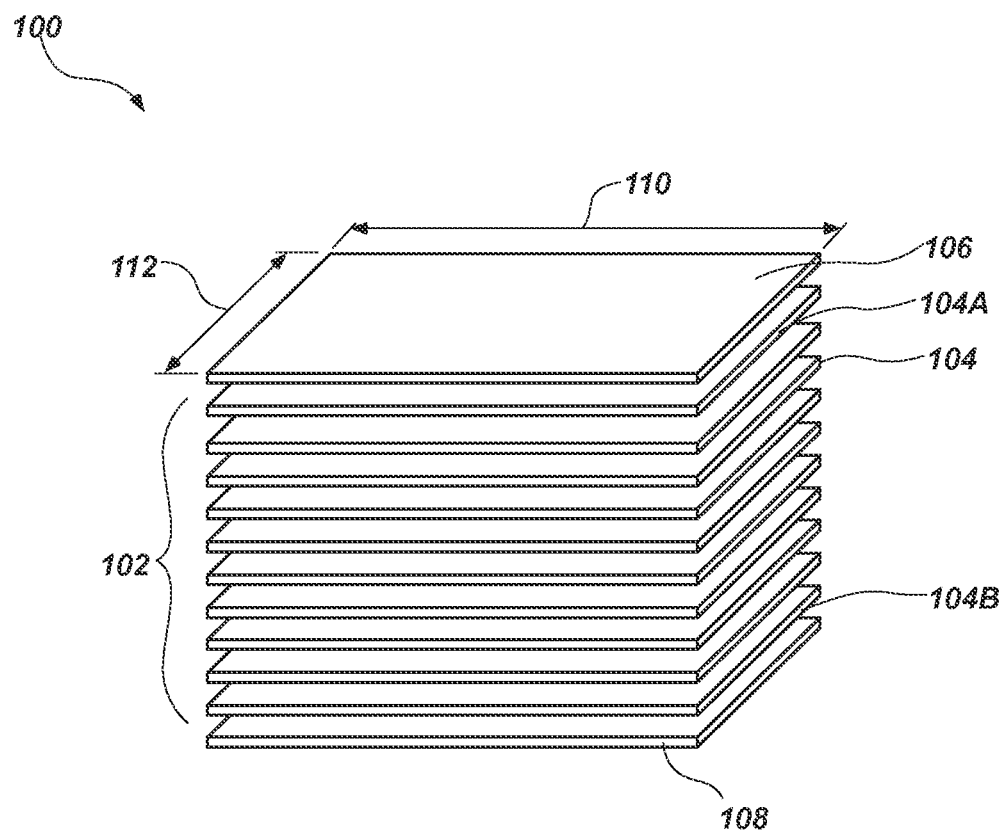
FIG. 1 is an exploded view of an energy harvesting device with a stacked layer of piezoelectric thin films sandwiched between a top electrode and a bottom electrode pursuant to an illustrative embodiment of the present invention.

For the purposes of promoting an understanding of the principles in accordance with the disclosure, reference will now be made to the illustrative embodiments shown in the drawings, and specific language will be used to describe them. It will nevertheless be understood that no limitation of the scope of the disclosure is thereby intended. Any alterations and further modifications of the inventive features illustrated herein, and any additional applications of the principles of the disclosure as illustrated herein, which would normally occur to one skilled in the relevant art and having possession of this disclosure, are to be considered within the scope of the disclosure claimed.

It must be noted that, as used in this specification and the appended claims, the singular forms "a," "an," and "the" include plural referents unless the context clearly dictates otherwise. As used herein, the terms "comprising," "including," "having," "containing," "characterized by," and grammatical equivalents thereof are inclusive or open-ended terms that do not exclude additional, unrecited elements or method steps.

Referring now to FIG. 1, there is shown an energy harvesting device 100 pursuant to an illustrative embodiment of the present invention. The energy harvesting device 100 includes a stacked layer 102 of a plurality of piezoelectric thin films 104. It will be appreciated that although multiple piezoelectric thin films 104 are shown in FIG. 1 in the stacked layer 102, that the energy harvesting device 100 may include a single piezoelectric thin film 104 or multiple piezoelectric thin films 104. That is, as understood by those skilled in the art, the stacking of multiple piezoelectric thin films 104 has the potential to generate more energy than just a single piezoelectric thin film 104. In an illustrative embodiment, the stacked layer 102 has eight to twelve piezoelectric thin films 104, or about ten piezoelectric thin films 104.

In an illustrative embodiment, each of the piezoelectric thin films 104 is formed from a composite of polymer and an inorganic material, such as a ceramic or an oxide. The inorganic material may comprise nanowires. In an illustrative embodiment, the polymer is a fluoropolymer. In an illustrative embodiment, the polymer is PVDF. In an illustrative embodiment, the inorganic material used in the piezoelectric thin films 104 is an oxide, such as zinc oxide (ZnO), or lead titanate ($PbTiO_3$). In an illustrative embodiment, the inorganic material used in the piezoelectric thin films 104 is formed of nanowires.

In an illustrative embodiment, the inorganic material comprises about 5% to about 20% of the piezoelectric thin films 104. In an illustrative embodiment, the inorganic materials comprise about 10% to about 15% of the piezoelectric thin films 104. It will be appreciated that the use of the inorganic material increases the frequency response of the piezoelectric thin films 104 as compared to the low frequency of the polymer material. That is, the addition of the inorganic material increases the pliability and recovery of the polymer material.

A manner of fabricating the piezoelectric thin films 104 used in the energy harvesting device 100 will now be described pursuant to an illustrative embodiment of the present invention. However, it will be appreciated that the manner in which the piezoelectric thin films 104 are fabricated is not limited to any particular method, and that the present invention contemplates that the piezoelectric thin films 104 may be manufactured pursuant to a wide variety of methods.

Pursuant to an illustrative embodiment, PVDF pellets are dissolved in an organic compound, such as N,N-dimethylformamide (DMF), along with zinc oxide nanowires. Thin films may then be obtained from the solution using a variety of methods. For example, thin films may be formed from the solution by solution casting or spin casting onto either a glass or silicon substrate as is known to those having skill in the art. In particular, spin coating is a known procedure used to apply uniform thin films to flat substrates. An excess amount of the solution is placed on the substrate, which is then rotated at high speed in order to spread the fluid by centrifugal force.

Rotation is continued while the fluid spins off the edges of the substrate, until the desired thickness of the film is achieved. The applied solvent is usually volatile, and simultaneously evaporates. So, the higher the angular speed of spinning, the thinner the film. The thickness of the film also depends on the concentration of the solution and the solvent. Once dry, the thin films may be removed from the substrates.

The thin films formed from the solution are then mechanically stretched to align the PVDF molecules and nanowires. In an illustrative embodiment, the thin films are stretched 3 to 5 times their original length. After stretching, the thin films may then be corona poled with a needle voltage of about 14 kV and a grid voltage of about 2 kV and at a temperature of 80 degrees Celsius. It will be appreciated that the polar, β-phase is the desired phase for the piezoelectric thin films 104 utilized with the present invention in order to maximize the piezoelectric response of the energy harvesting device 100.

Figure 2:
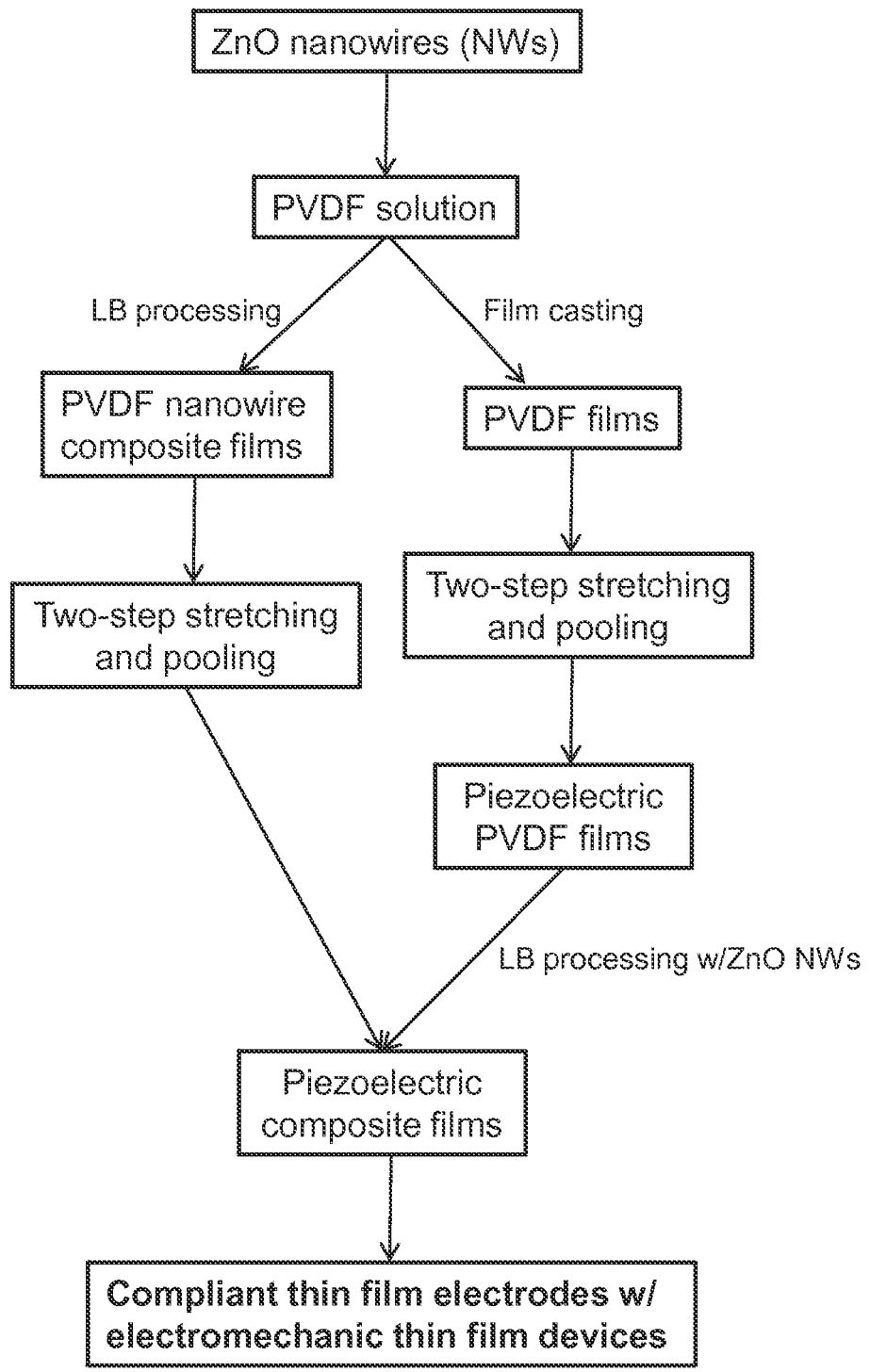
FIG. 2 is a flowchart showing exemplary manufacturing methods of the present invention.

FIG. 2 illustrates exemplary manufacturing methods of the present invention. Generally, a PVDF device would have low acoustic impedance (4 Mrayls), would have low manufacture cost, and would be flexible for large mechanical deformation. However, these PVDF films have large dielectric losses and low electromechanic coupling efficiency. The composite of the present invention, made of inorganic piezoelectric materials and PVDF, complement the high frequency (on the order of 50 to 80 MHz) as well as coupling efficiency.

Using Langmuir-Blodgett processing, piezolelectric composites of the present invention, made from inorganic nanowires and piezoelectric polymers, provide the unprecedented means for electromechanic coupling efficiency for piezoelectric devices, while maintaining low acoustic impedance (4 Mrayls), low manufacture cost, and flexibility for large mechanical deformation. Piezoelectric polymers and inorganic nanowires have to be carefully processed to form composites so that the piezoelectric properties from both constituents are maintained.

An exemplary method of manufacturing includes the use of nonpolar solvents (chloroform) which disperse both PVDF and ZnO well and alignment of PVDF and ZnO in the nanostructures to respond to the mechanical deformation or mechanical force in the same directions. A Langmuir-Blodgett processing technique was used to form the composite films. PVDF and ZnO nanowires were dispersed onto the air-water interface of a LB trough. Barriers on each side of the polymer and nanowire film reduced the available area, forcing the high aspect ratio polymers and nanowires into a parallel arrangement. To transfer the film onto a solid substrate, a glass slide was pulled through the dip well to deposit the composite film. Highly organized PVDF and ZnO were observed with scanning electron microscopy (SEM) on the micron scale.

A manner of fabricating the electrodes 106 and 108 will now be described pursuant to an illustrative embodiment of the present invention. It will be appreciated that the manner in which the electrodes 106 and 108 are fabricated is not limited to any particular method, and that the present invention contemplates that the electrodes 106 and 108 may be manufactured pursuant to a wide variety of methods.

Pursuant to an illustrative embodiment, carbon nanotubes and graphene are placed into an organic solution. The electrodes 106 and 108 may be formed from the solution by solution casting or spin casting onto the piezoelectric thin films 104. In an illustrative embodiment, the electrodes 106 and 108 are applied to the stacked layers 102 through a Langmuir-Blodgett process.

An exemplary manufacturing process includes the electrophoretical deposition of compliant electrodes. The method forms a very thin layer of highly conductive carbon nanostructure materials as the compliant electrode for the piezoelectric device. Electrophoretical deposition (EPD) is used to form the thin film electrodes on the piezoelectric composite film. A home-made EDP set includes a pair of vertical suspension of the already made piezoelectric composite substrates and a dip coater. The dip coater slowly removes the substrates at rates as slow as 4 mm/min, with the voltages varying from 30-60V depending on the desired thickness. The voltage is kept on during the removal of the substrate from the colloidal solution of carbon nanotube or graphene. The thickness of the electrode can be tuned from 100 nm to 1 µm. For a thicker electrode, the substrates may be positioned parallel, instead of perpendicular, to the surface of the colloidal solution to avoid shear forces as much as possible. The thicker films are usually formed with carbon nanotube or carbon nanotube composite with graphene.

Referring back to FIG. 1, disposed on the topmost one 104A of the piezoelectric thin films 104 in the stacked layer 102 is an electrode 106. Likewise, disposed on the bottommost one 104B of the piezoelectric thin films 104 in the stacked layer 102 is an electrode 108. In an illustrative embodiment, the electrodes 106 and 108 cover the entire end surface of the respective sides of the topmost one 104A of the piezoelectric thin films 104 and the bottommost one 104B of the piezoelectric thin films 104.

In an illustrative embodiment, the electrodes 106 and 108 comprise a compliant material. In an illustrative embodiment, the electrodes 106 and 108 are formed from nanotubes, such as carbon nanotubes. (A nanotube is a minute cylinder of rolled-up atoms: an extremely thin metallic or semiconducting cylinder, capped at one end, consisting of a rolled-up layer of fullerene-structured carbon atoms). In an illustrative embodiment, the electrodes are formed from graphene.

In an illustrative embodiment, the energy harvesting device 100 may have a width 112 and a length 110. In an illustrative embodiment, the width 112 is about 2 inches (about 5.1 cm) and the length 110 is about 4 inches (about 10.2 cm). It will be appreciated that other dimensions may be utilized. In an illustrative embodiment, each of the piezoelectric thin films 104 has a thickness of about 25 µm to 100 µm. In an illustrative embodiment, each of the piezoelectric thin films 104 has a thickness of 50 µm. The piezoelectric thin films of the present invention may range in thickness from <10 µm to approximately 120 µm.

Figure 3:
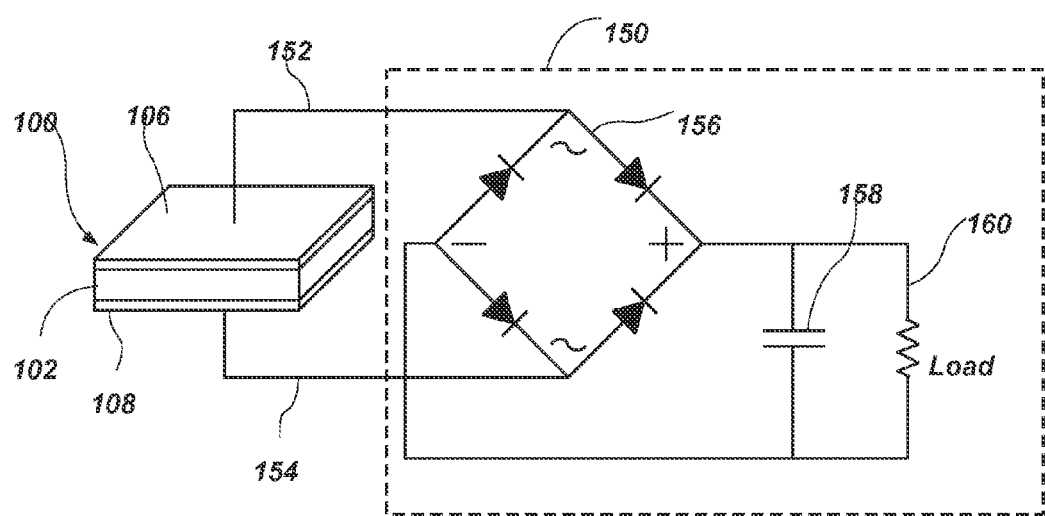
FIG. 3 is a block diagram of an energy harvesting device connected to an energy harvesting circuit; and, FIG. 4 is a block diagram of an energy harvesting device mounted to a structure in an environment suited to generate energy from wind.

Referring now to FIG. 3, in operation, the energy harvesting device 100 is connected to an energy harvesting circuit 150 by a first lead 152 and a second lead 154. The first lead 152 is connected to the electrode 106 and the second lead 154 is connected to the electrode 108. The first lead 152 and the second lead 154 are connected to a rectifier 156. It will be appreciated that the rectifier 156 may be an active or a passive rectifier. But, a passive rectifier may be desirable since it is easy to build by discrete components and requires no extra power. An active rectifier, on the other hand, requires extra power, which would not be suitable for most applications of the energy harvesting device 100. In an illustrative embodiment, the rectifier 156 is a full-wave rectifier or a half-wave rectifier.

The energy harvesting circuit 150 further includes a capacitor 158. The capacitor 158 stores power generated by the energy harvesting device 100. The size of the capacitor 158 is determined by the requirements of a load 160 and the amount of power generated by the energy harvesting device 100.

Figure 4:
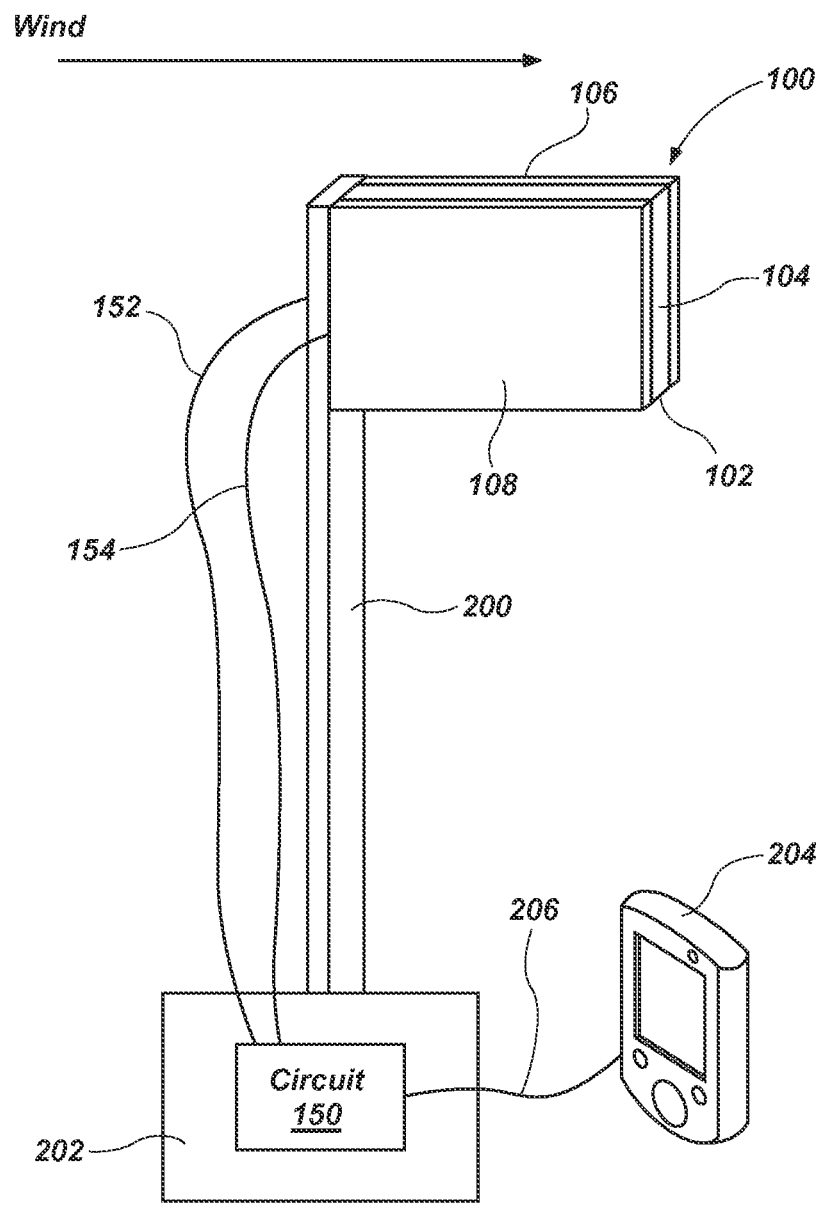

Referring now to FIG. 4, there is depicted the energy harvesting device 100 in an environment to produce energy from a charge generator, such as a stream of wind. In particular, in FIG. 3, the energy harvester 100 is able to generate energy from wind. In this application, the energy harvesting device 100 is mounted to an elongated structure 200. The elongated structure 200 is attached to a base member 202. Mounted within the base member 202 is an energy harvesting circuit 150. The first lead 152 and the second lead 154 extend from the electrodes on the energy harvesting device 100 to the circuit 150. The circuit 150 may provide energy to a load 204, such as an electrical device, that is attached by a lead 206 to the circuit 150. For example, the circuit 150 may be utilized to charge an electronic device, such as a laptop or smart phone.

In addition, the load 204 may include a sensor or some other low-voltage electronic device.

The operation of the energy harvesting device 100 will now be explained pursuant to an illustrative embodiment of the present invention. The wind causes the energy harvesting device 100 to mechanically deform. For example, the energy harvesting device 100 may flap or oscillate in the wind somewhat similar to a flag, or twist diagonally. The placement of the energy harvesting device 100 should allow the energy harvesting device 100 to oscillate. In an illustrative embodiment, the structure 200 acts as an obstacle to create a vortex in its wake. The vortex causes stronger oscillations of the energy harvesting device 100.

As the energy harvesting device 100 mechanically deforms due to the wind, the stacked layer 102 of piezoelectric thin films 104 generates a current that is directed to the energy harvester circuit 150 by the leads 152 and 154. The circuit 150 may be utilized to provide energy to a load 204. In an illustrative embodiment, the circuit 150 may provide about 1 W of power. The energy harvesting device 100 may operate best in wind speeds of about 10 mph to 45 mph.

It will be appreciated that the energy harvesting device 100 may be utilized in a wide range of applications. For example, the energy harvesting device 100 can be utilized to generate energy from any moving stream or current, such as a water current or stream.

In the foregoing Detailed Description, various features of the present disclosure are grouped together in a single illustrative embodiment for the purpose of streamlining the disclosure. This method of disclosure is not to be interpreted as reflecting an intention that the claimed disclosure requires more features than are expressly recited in each claim. Rather, as the following claims reflect, inventive aspects lie in less than all features of a single foregoing disclosed illustrative embodiment. Thus, the following claims are hereby incorporated into this Detailed Description of the Disclosure by this reference, with each claim standing on its own as a separate illustrative embodiment of the present disclosure.

It is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been shown in the drawings and described above with particularity and detail, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. An apparatus for energy harvesting, said apparatus comprising:
    a piezoelectric polymer composite having a first side and a second side, the piezoelectric polymer composite comprising an inorganic material;
    a first electrode disposed on the first side of the piezoelectric polymer composite; and
    a second electrode disposed on the second side of the piezoelectric polymer composites;
    wherein the inorganic material comprises nanowires.

2. The apparatus of claim 1, wherein the inorganic material comprises a ceramic.

3. The apparatus of claim 1, wherein the inorganic material comprises an oxide.

4. The apparatus of claim 1, wherein the inorganic material comprises zinc oxide.

5. The apparatus of claim 1, wherein the inorganic material comprises lead titanate.

6. The apparatus of claim 1, wherein the inorganic material comprises about 5% to about 20% of the piezoelectric polymer composite.

7. The apparatus of claim 1, wherein the inorganic material comprises about 10% to about 15% of the piezoelectric polymer composite.

8. The apparatus of claim 1, wherein the piezoelectric polymer composite comprises polyvinylidene fluoride.

9. The apparatus of claim 1, wherein the piezoelectric polymer composite comprises a fluoropolymer.

10. The apparatus of claim 1, wherein the first electrode and the second electrode comprise nanotubes.

11. The apparatus of claim 1, wherein the first electrode and the second electrode each comprises one of carbon nanotubes and graphene.

12. The apparatus of claim 1, wherein the piezoelectric polymer composite comprises one or more thin films formed from polyvinylidene fluoride and zinc oxide nanowires and the first and second electrodes each comprises one of carbon nanotubes and graphene.

13. The apparatus of claim 1, wherein the piezoelectric polymer composite comprises a stacked layer of thin films.

14. A method of fabricating an energy harvester, said method comprising:
    forming a piezoelectric material from a polymer and an inorganic material, the piezoelectric material having a first side and a second side;
    installing a first electrode on the first side of the piezoelectric material; and
    installing a second electrode on the second side of the piezoelectric material;
    wherein the inorganic material comprises nanowires.

15. The method of claim 14, wherein the inorganic material comprises a ceramic.

16. The method of claim 14, wherein the inorganic material comprises one of zinc oxide and lead titanate.

17. The method of claim 14, wherein the inorganic material comprises about 5% to about 20% of the piezoelectric material.

18. The method of claim 14, wherein the inorganic material comprises about 10% to about 15% of the piezoelectric material.

19. The method of claim 14, wherein the polymer comprises polyvinylidene fluoride.

20. The method of claim 14, wherein the first electrode and the second electrode each comprises one of carbon nanotubes and graphene.

21. The method of claim 14, wherein the piezoelectric material comprises a stacked layer of thin films formed from polyvinylidene fluoride and zinc oxide nanowires and the first and second electrodes each comprises one of carbon nanotubes and graphene.

22. A method of energy harvesting, said method comprising:
    placing a piezoelectric device in a stream such that the piezoelectric device oscillates;
    collecting energy from the piezoelectric device; and
    storing the energy collected from the piezoelectric device;
    wherein the piezoelectric device comprises a stacked layer of thin films each formed from a composite of a polymer and an inorganic material;
    wherein the stacked layer of thin films is sandwiched between a first electrode and a second electrode; and wherein the inorganic material comprises nanowires.

23. The method of claim 22, wherein the stream is a wind stream.

24. The method of claim 22, wherein the inorganic material comprises a ceramic.

25. The method of claim 22, wherein the inorganic material comprises one of an oxide, zinc oxide and lead titanate.

26. The method of claim 22, wherein the inorganic material comprises about 5% to about 20% of the composite.

27. The method of claim 22, wherein the inorganic material comprises about 10% to about 15% of the composite.

28. The method of claim 22, wherein the polymer comprises polyvinylidene fluoride.

29. The method of claim 22, wherein the first electrode and the second electrode each comprises one of carbon nanotubes and graphene.

30. The method of claim 22, wherein the composite comprises polyvinylidene fluoride and zinc oxide nanowires and the first and second electrodes each comprises one of carbon nanotubes and graphene.

* * * * *